United States Patent
Loh et al.

(10) Patent No.: US 7,324,391 B2
(45) Date of Patent: Jan. 29, 2008

(54) METHOD FOR DETERMINING AND CLASSIFYING SRAM BIT FAIL MODES SUITABLE FOR PRODUCTION TEST IMPLEMENTATION AND REAL TIME FEEDBACK

(75) Inventors: Wah Kit Loh, Richardson, TX (US); Md Abul Bashar Khan, Dallas, TX (US); Kemal Tamer San, Plano, TX (US); Jon Charles Lescrenier, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 5 days.

(21) Appl. No.: 11/100,067

(22) Filed: Apr. 6, 2005

(65) Prior Publication Data

US 2006/0227634 A1    Oct. 12, 2006

(51) Int. Cl.
*G11C 7/00*    (2006.01)

(52) U.S. Cl. .............. 365/201; 365/154; 365/156; 714/720

(58) Field of Classification Search ........... 365/201, 365/154, 156; 714/720
See application file for complete search history.

(56) References Cited

U.S. PATENT DOCUMENTS

| | | | | |
|---|---|---|---|---|
| 4,879,690 A | * | 11/1989 | Anami et al. | 365/201 |
| 6,992,916 B2 | * | 1/2006 | Liaw | 365/154 |
| 2004/0015757 A1 | * | 1/2004 | Ohlhoff et al. | 714/719 |

* cited by examiner

*Primary Examiner*—Son Dinh
*Assistant Examiner*—N Nguyen
(74) *Attorney, Agent, or Firm*—Jacqueline J. Garner; W. James Brady, III; Frederick J. Telecky, Jr.

(57) ABSTRACT

A method (200) for determining various bit failure modes in a static random access memory device. A hard/soft bit failure test sequence is performed on each cell of the memory device to determine whether the cell exhibits a hard bit failure or a soft bit failure, then a data retention test is performed on the cell having soft bit failure to determine whether the cell exhibits a data retention failure. A write or disturb test sequence is then performed on the cell not having data retention failure, and a read or disturb test sequence is performed on the cell having write or disturb failure. Finally, a disturb test sequence is performed on the cell having read or disturb failure, and then an analysis is performed on the data from the tests to determine whether the cell exhibits one of a write, read, or disturb failure.

22 Claims, 8 Drawing Sheets

| TEST MODE | PASS VDD | FAIL VDD | PASS VDD | FAIL CLASSIFICATIONS | |
|---|---|---|---|---|---|
| T1 RETENTION | Wrt DATA Rd DATA | WAIT (1 SEC) | Rd DATA | (a) P/x/P – No slew or data reten., do T2 | |
| | | | | (b) P/x/F – Retention/Unstable | |
| T2 WRITE OR DISTURB | Wrt ~ DATA Rd ~ DATA | Wrt DATA | Rd DATA | (a) P/x/P – No Write issue, do T3 | |
| | | | | (b) P/x/F – Write / Disturb, do T3 | |
| T3 READ OR DISTURB OR VOLTAGE SLEW | Wrt DATA Rd DATA | Rd DATA | Rd DATA | (a) P/P/P – Write | |
| | | | | (b) P/F/F – Read / Disturb, do T4 | |
| | | | | (c) P/F/P – Read | |
| | | | | (d) P/P/F – Voltage slew | |
| T4 READ OR DISTURB | Wrt DATA Rd DATA | RdP DATA | Rd DATA | (a) P/P/P – Read, do T5 | |
| | | | | (b) P/P/F – Disturb | |
| ENGINEERING MODE T5 | WrtF ~ DATA WrtF DATA | RdF DATA | XXX | (a) X/P/X – Disturb | |
| | | | | (b) X/F/X – Read / Disturb | |

FIG. 8A

| Wrt | = Write entire bank |
|---|---|
| WrtF | = Write only the target bit |
| Rd | = Read entire bank |
| RdP | = Read non-failing Columns on same row. |
| RdF | = Read only the target bit |
| ~ | = Inverse data |

FIG. 8B

| 1. Retention / Unstable (1) | - 1b |
|---|---|
| 2. Write | - 1a + 2b + 3a |
| 3. Read | - 1a + 2a + 3c / 1a + 2a + 3b + 4a + [5b] |
| 4. Disturb | - 1a + 2b + 3b + 4b + [5a] / 1a + 2b + 3b + 4b + [5b] |

FIG. 8C

METHOD FOR DETERMINING AND CLASSIFYING SRAM BIT FAIL MODES SUITABLE FOR PRODUCTION TEST IMPLEMENTATION AND REAL TIME FEEDBACK

FIELD OF INVENTION

The present invention relates generally to semiconductor processing, and more particularly to testing methods for the determination and classification of the various bit failure modes of static random access memory (SRAM).

BACKGROUND OF THE INVENTION

Memory test algorithms are written to uncover faults with storage cells and the access to these storage cells arising from improper design, lack of design margins or processing deficiencies. Generally, these algorithms are written to be extensive and exhaustive to ensure that no bit defects, either hard defects or intermittent failures find their way into the field.

Understanding memory fail modes is crucial to providing accurate corrective actions to wafer fabrications for sustained yield improvements. Current test algorithms are aimed at detecting bits that do not meet a certain performance criteria. In one failure mode (hard fail), bits may be stuck at a certain data state at all voltages, or in another failure mode (soft fail) the bits may be unable to be read from or written to at certain voltages. When these soft fails occur, it is usually at the extreme voltage corners of a device voltage range, but failures within a smaller voltage range, or what is known in the industry as "shmoo hole fails" are also not unusual.

These defective bits are identified as bad during test and repaired using redundant bits. When it is not possible to repair all the bad bits, the chip is marked as defective and rejected during bin sorting. No attempt is made to identify the failure mode. Reject units are then taken off line for further electrical analysis and later, perhaps physical failure analysis. During off-line analysis, more extensive voltage, temperature and timing characterization is performed to determine the conditions at which the bad bits begin to pass. More elaborate testing on the target fail bits may be done to determine if the failure is a write, a read or a disturb failure. This determination is usually performed by reading or writing at a known passing voltage and then writing and reading at the failing voltages. However, it is much more difficult to tell if a bit is failing due to a disturb failure or a read failure as cells always go through a disturb phase before they are read.

A write fail would suggest that the pass gate or access transistor is weak relative to the load transistor and the drive transistor. Hence, by increasing the drive current for access transistors through bit re-design, transistor engineering, or boosting the word line voltage during write cycles, write fails could be minimized once this failure mode is identified.

A read fail suggests that there may be insufficient voltage differential across the sense amplifiers when the amplifiers are enabled. For fast access times, sense amplifiers are turned on as soon as it is thought that there is enough voltage developed across the bit line and its complement, based on simulations. If the access transistors, and/or driver devices are weaker than expected, the bit line voltage differentials will not be sufficient to overcome imbalances in the sense amplifiers and an incorrect data state is output. This incorrect state may or may not be written back into the bit.

As many bits are connected to a single word line, all bits along the accessed word line will be enabled (bits connected to their respective bit lines). Not all bit lines, however, are connected to the sense amplifiers. Only those bits that are to be read will have their bit lines connected to the sense amplifiers via local and global multiplexers. In other words, not all cells along the accessed word line are read. Despite not being read, when cells are imbalanced, the act of connecting them to bit lines that are pre-charged to the supply voltage (e.g., Vcc) can result in cell upsets. One reason for an upset is a low Vt on the driver of the side of the bit wherein a "1" data state is stored. Another reason for an upset may be that the load transistors are weak. Hence, a strong N channel and a weak P channel condition within the memory device would cause disturb fails.

In addition, data retention tests are also being performed with more frequency lately as memory cells are required to retain data in a sleep mode or what is commonly referred to as "data retention" mode. In this mode, storage cells have reduced voltages applied across them to minimize leakage currents during the standby condition. Accordingly, there is a growing need for testing data retention failures that may arise as a result of such leakage conditions in the manufacturing of semiconductor memory devices.

It is clear that depending on the failure type, different corrective actions will be chosen to improve electrical bit yield and hence swift and accurate real-time analysis is of high importance to providing directions for future production lot starts and design modifications.

Semiconductor memories can, for example, be characterized as volatile random access memories (RAMs) or non-volatile read only memories (ROMs), where RAMs can either be static (SRAM) or dynamic (DRAM) differing mainly in the manner by which they store a state of a bit. In SRAM, for example, each memory cell includes transistor-based circuitry that implements a bistable latch, which relies on transistor gain and positive (e.g., reinforcing) feedback so that it can only assume one of two possible states, namely on (state 1) or off (state 2). The latch can only be programmed or induced to change from one state to the other through the application of a voltage or other external stimuli. This arrangement is desirable for a memory cell since a state written to the cell will be retained until the cell is reprogrammed.

DRAMs on the other hand implement a capacitor that is either charged or discharged to store the on (state 1) or off (state 2) state of a cell. Capacitors discharge over time, however, and DRAMs must therefore be periodically 'refreshed'. Also, a bistable latch can generally be switched between states much faster than the amount of time it takes to charge or discharge a capacitor. Accordingly, SRAMs are a desirable type of memory for certain types of applications.

SRAM is typically arranged as a matrix of memory cells fabricated in an integrated circuit chip, and address decoding in the chip allows access to each cell for read/write functions. SRAM memory cells use active feedback from cross-coupled inverters in the form of a latch to store or "latch" a bit of information. These SRAM memory cells are often arranged in rows so that blocks of data such as words or bytes can be written or read simultaneously. Standard SRAM memory cells have many variations. The basic CMOS SRAM cell generally includes two n-type (nMOS) pull-down or drive transistors and two p-type (pMOS) load transistors in a cross-coupled inverter configuration, with two additional nMOS select transistors added to make up a six-transistor cell (a 6T cell).

Accordingly, there is a need for a memory testing technique to quickly differentiate between various soft bit failure modes particularly in an SRAM device in a production testing environment.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The present invention is directed to a test method to identify and classify the various bit failure modes of SRAM memory devices particularly during production testing of these memory devices. The method utilizes a specific ordering of test sequences and an analysis of the data resulting from these tests to uniquely classify the failure mode identified in a target cell of the memory device. For example, in one or more aspects of the present invention, the method may be used to identify data retention failures, write, read, or disturb failures in SRAM devices.

In one aspect of the present invention the method comprises conducting a defect activating test sequence (e.g., a standard series of production test algorithms) for determining hard bit failures and soft bit failures. The method then conducts a defect activating test comprising a data retention test on each cell that indicated a soft bit failure to determine whether the cell exhibits a data retention failure.

Optionally, a write or disturb test sequence may be used in the method on the target cell not having a data retention failure to determine whether the cell exhibits a write or disturb failure. In another aspect of the invention, a read or disturb test sequence may also be used on the cell to determine whether the cell exhibits a read or disturb failure.

In yet another aspect of the invention, a disturb test sequence may further be used on the cell having a read or disturb failure to determine whether the cell exhibits a disturb failure. In still another aspect of the invention, the data resulting from the various tests performed is data logged and analyzed to determine uniquely whether the cell exhibits a write, read, or disturb failure.

The method of the present invention may further comprise an off-line engineering mode test sequence on the cell that indicates a read failure to confirm whether the target cell has a read failure or a disturb failure.

In one aspect the data retention test sequence comprises writing and first reading data to a target cell at a passing test voltage (e.g., Vnominal, Vdd, Vcc, about 1.2V), waiting for a predetermined time (e.g., about 2 ms to about 3 seconds) at a failing voltage (e.g., Vlo=0.8V, Vhi=1.6V), then reading the cell a second time at a passing voltage level, then analyzing the test results of the first and second read to determine whether a data retention or unstable condition exists.

In another aspect of the invention, the write or disturb test sequence comprises writing and first reading inverse data to/from the cell at a passing test voltage (e.g., Vnominal, Vdd, Vcc, about 1.2V), writing true data at a failing voltage (e.g., Vlo=0.8V, Vhi=1.6V), then reading the cell a second time at a passing voltage level, then analyzing the test results of the first and second read to determine whether a write or disturb failure exists.

In yet another aspect, the read or disturb test sequence comprises writing and first reading data to/from the cell at a passing test voltage (e.g., Vnominal, Vdd, Vcc, about 1.2V), second reading data at a failing voltage (e.g., Vlo=0.8V, Vhi=1.6V), then third reading the cell at a passing voltage level, then analyzing the test results of the first, second, and third read to determine whether a write, read/disturb, or read failure exists, or whether a voltage slew condition exists.

In still another aspect of the invention, the disturb test sequence comprises writing and first reading data to/from the cell at a passing test voltage (e.g., Vnominal, Vdd, Vcc, about 1.2V), second reading data from non-failing columns on a same row of the memory at a failing voltage (e.g., Vlo=0.8V, Vhi=1.6V), then third reading the cell at a passing voltage level, then analyzing the test results of the first, second, and third read to determine whether a read or disturb failure exists.

Thus, by sequentially narrowing the tests in on the various failure types, a clear determination may be made of the failure classification of each soft bit failed cell of an SRAM memory device.

In another aspect of the present invention, a checkerboard or an inverse checkerboard test pattern data may be used in the data retention test sequence and one or more subsequent test sequences.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

DETAILED DESCRIPTION OF THE INVENTION

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, known structures and devices are shown in block diagram form in order to facilitate describing one or more aspects of the present invention.

The present invention pertains to a testing method utilizing one or more test sequences for classifying among the various soft bit failure modes of a memory cell, particularly of an SRAM memory device during production testing.

As previously indicated, depending on the failure type, different corrective actions will be chosen in the present invention to improve electrical bit yield and therefore provide directions for swift and accurate real time analysis for future production lot starts and design modifications for improving memory devices. Further, the data resulting from the various tests performed may be data logged and analyzed to determine uniquely whether the cell exhibits one of the failure modes (e.g., a write, read, or disturb failure). Some of the enabling technologies that have allowed this procedure to be implemented are the rapid gathering of bit fail count information of each of test sequence or algorithm at the die level, script driven storage and retrieval of fail count information from a database, and script driven analysis of data. The method of the present invention will become more apparent in association with the discussion of the following figures.

Figure 1:
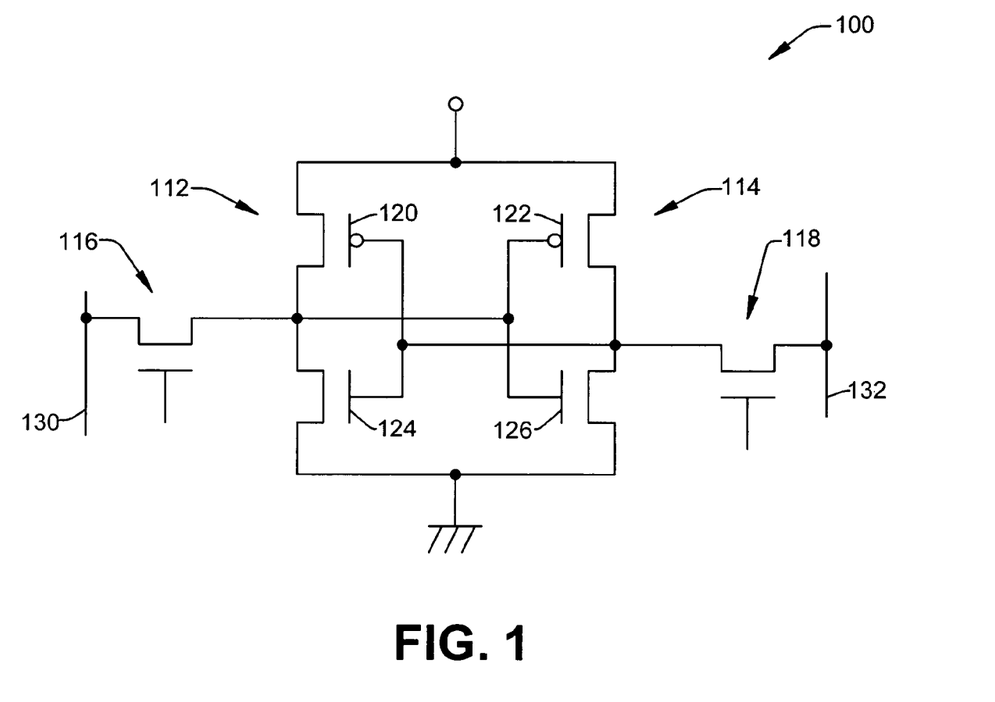
FIG. 1 is a schematic diagram of a conventional 6T static random access memory (SRAM) cell.

FIG. 1 illustrates the schematic diagram for an exemplary SRAM circuit 100 such as may be used in association with the present invention, and wherein several aspects of the invention are presented.

FIG. 1, for example, illustrates a typical static random access memory (SRAM) cell 100 generally comprising a pair of cross-coupled inverters 112, 114 to store a data bit state and a pair of pass transistors 116, 118 to read and write a data bit between the cross-coupled inverters 112, 114 and bitlines 130, 132. Respective inverters 112, 114 comprise a p-type MOS (pMOS) pull-up or load transistor 120, 122 and an n-type (nMOS) pull-down transistor 124, 126. Transistors 116, 118 are generally n-type as well. This type of SRAM cell comprises six transistors and is termed a 6T full CMOS SRAM cell. When the channels of all the transistors are formed in the single crystal silicon substrate, it is called a single crystalline bulk CMOS 6T SRAM cell. It is also referred to as a planar SRAM cell when all the transistors are made in the same substrate material (e.g., bulk crystalline silicon, SOI, etc.).

In general, SRAM cells are more stable and have better data retention where the respective pMOS (120, 122) and nMOS (124, 126) transistors are matched for the two inverters (112, 114). However, as dimensions are reduced to scale down devices, the relative sub-threshold leakage currents between the load and driver devices of an SRAM and the leakages due to manufacturing defects becomes a strong factor affecting the stability and data retention capability of the SRAM device, while mis-matches in capacitive coupling between internal nodes of SRAM bits and the Vcc power supply may affect whether the device will exhibit slew rate failures.

In FIGS. 2-7, one or more SRAM cells similar to that of cell 100 of FIG. 1 may be tested in accordance with method 200 and test sequences discussed to classify a soft bit failure of a memory cell among the various soft bit failure modes examined. Accordingly, in addition to those failure modes examined, other failure modes may also be tested in accordance with the method of the present invention. While the method 200 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects of the present invention. Further, one or more of the acts depicted herein may be carried out in one or more separate acts or phases. Additionally, while the discussion herein is with made within reference to SRAM, it is to be appreciated that one or more aspects of the present invention may have application to different types of memories and/or to other structures or circuits not illustrated or described herein.

Figure 2:
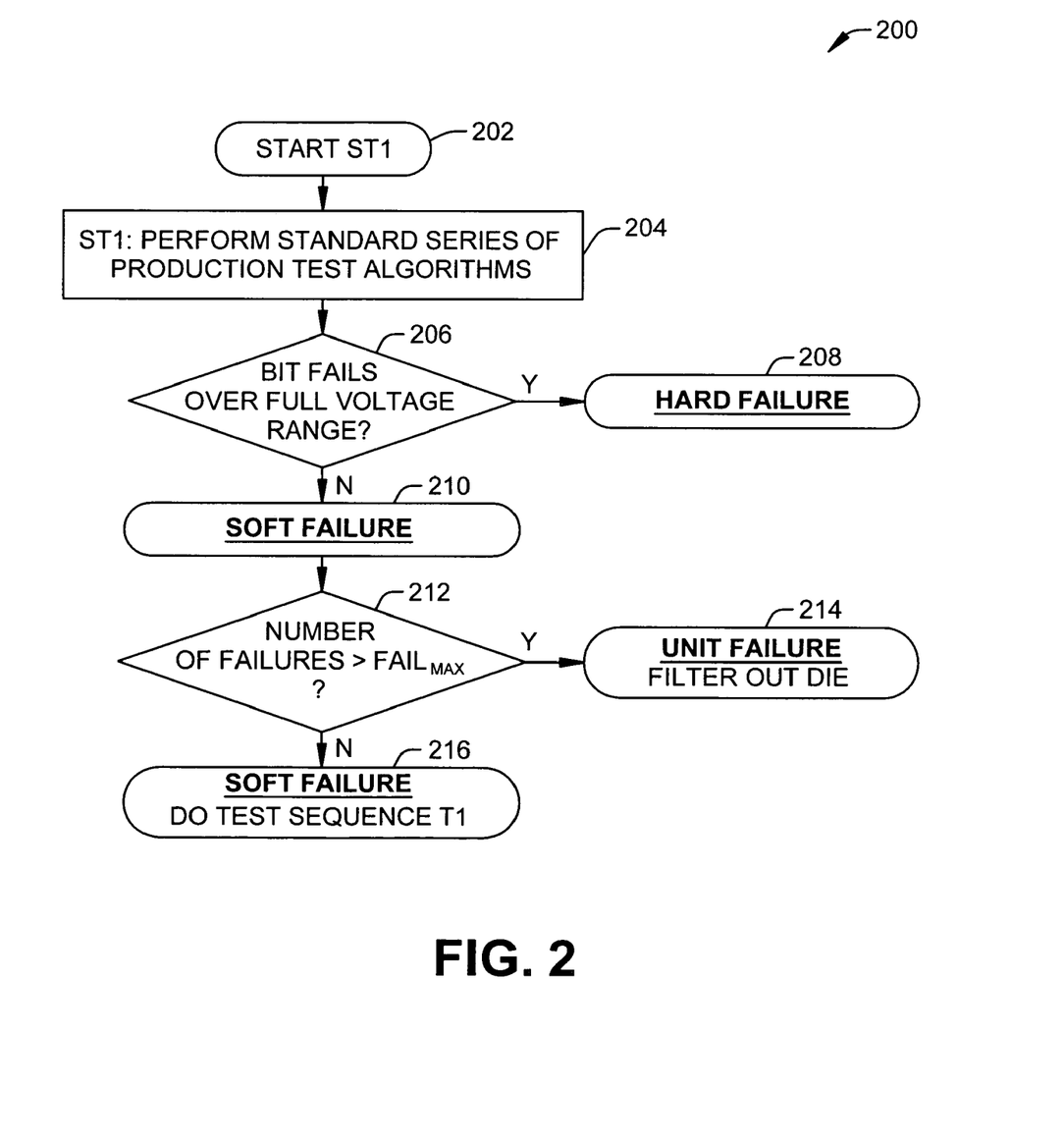
FIG. 2 is a flow diagram illustrating a testing method for identifying hard and soft bit failure modes in an SRAM memory device such as the cell of FIG. 1, utilizing a conventional series of production test algorithms such as may be used in accordance with an aspect of the present invention.

FIG. 2, for example, illustrates a flow diagram of an exemplary testing method 200 for identifying hard and soft bit failure modes in an SRAM memory device such as the cell 100 of FIG. 1. Method 200 may comprise a standard series of production test algorithms for identifying between hard and soft bit failure modes, and if enough failures exist, the die is filtered out of the testing in one aspect of the present invention. The hard and soft bit fail test sequence is conducted to activate or bring out these defects in the cells of a memory. As such, this portion of the method 200 is optional, in that it may be previously known which bits have hard or soft bit failures. The failure mode may be known, for example, from conventional hard/soft bit failure screening, but such screening is noteworthy because it may be used in combination with the other test sequences that will be discussed infra.

Initially, in the hard/soft bit failure test sequence ST1, 200, for example, the testing starts at 202, wherein a standard series of production test algorithms is used at 204 to test the bits of the memory array to determine at 206 whether the bits exhibit a hard bit failure 208 or a soft bit failure 210. Hard bit failures are bit failures that occur throughout the entire voltage range of interest, whereas soft bit failures are failures that occur within a smaller portion or sub-set of the full voltage range of interest. Thus, tests herein may be performed, for example, on the bits at a lower end of the voltage range (e.g., Vlo at about 0.8 V), at a nominal voltage (e.g., Vnom at about 1.2V, Vdd, Vcc), and at the upper end of the voltage range of interest (e.g., Vhi at about 1.6V). Accordingly, a goal of the present invention is to demonstrate that a variety of different failure modes can be classified by successively performing various testing sequences until a unique failure mode is obtained.

Returning to FIG. 2, when the number of soft failures identified at 210 are found at 212 to exceed a predetermined quantity (e.g., FAILMAX), the failing die may be filtered out of the testing and rejected at 214. Otherwise, if the number of soft bit failures is determined at 212 to be less than the predetermined allowable maximum, the cell is identified as a soft bit failure and soft bit failure testing continues at 216 to the next test sequence: data retention test sequence T1.

Although the following test sequences are described as being performed on a cell or target cell under test, it will be appreciated by those in the art, that it may be advantageous to perform one or more of the test sequences on multiple cells or the entire array of memory cells. Accordingly, the inventors of the present invention have found it beneficial to use a checkerboard or an inverse checkerboard test pattern on the test sequence steps of FIGS. 3-7.

Figure 3:
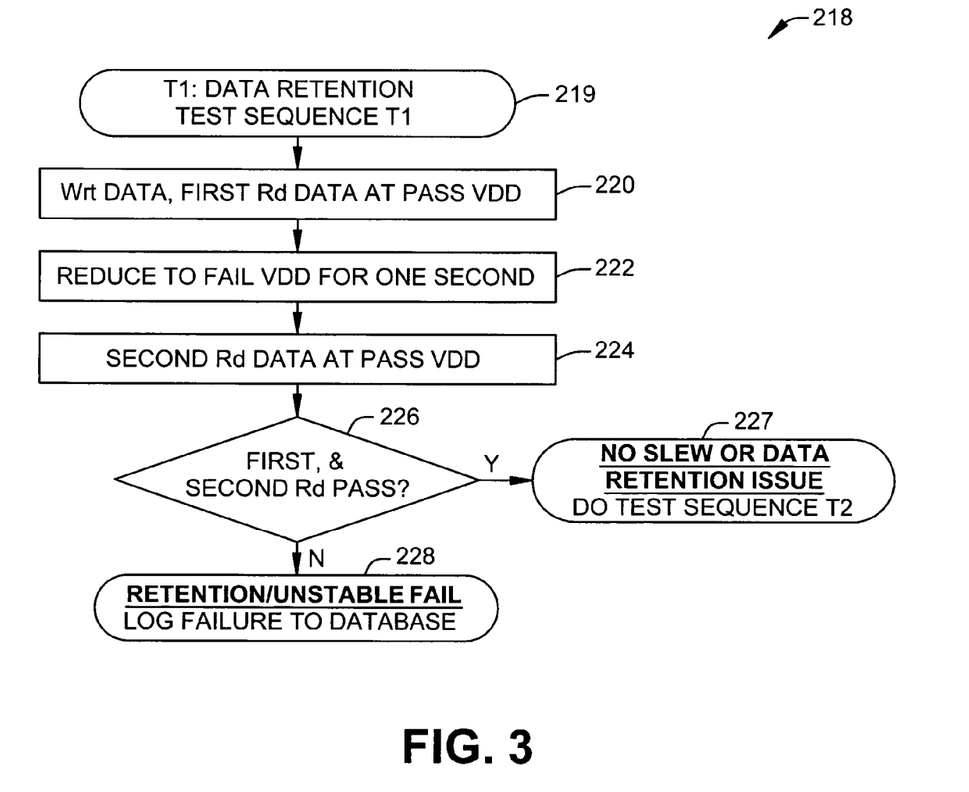
FIGS. 3-7 are flow diagrams illustrating an exemplary testing method comprising various test sequences for uniquely classifying among various soft bit failure modes of an SRAM memory device such as the cell of FIG. 1, in accordance with one or more aspects of the present invention.

FIG. 3 illustrates an exemplary T1 data retention test sequence 218 of method 200, in accordance with one or more aspects of the present invention. The data retention test sequence 218 is used to identify or classify data retention or unstable condition failures, and slew rate issue failures from among the various soft bit failure modes of an SRAM memory device such as the cell 100 of FIG. 1. Data retention test sequence 218 starts at 219 wherein at 220 data is written into a target cell (e.g., or the entire array of cells) at the passing test voltage (e.g., supply voltage, Vdd, Vcc, Vnom at about 1.2V) followed by a first reading of the data also at the passing voltage.

The test voltage is then changed at 222 to a failing voltage, for example, by reducing the voltage to the lower end of the test voltage range (e.g., Vlo at about 0.8 V), or by increasing the voltage to the upper end of the voltage range of interest (e.g., Vhi at about 1.6V) for a predetermined period of time (e.g., about 2 ms to about 3 seconds). Then at 224, the test voltage is again changed back to the passing voltage level and a second reading of the data is made.

The results of this test sequence are then evaluated at 226 to determine whether the first and second data readings have passed. If it is determined that both the first and second readings pass at 226, then it may also be concluded that no slew or data retention issues are present in the cell at 227, and the testing may continue to test sequence T2 for further classification. If, however, it is determined at 226 that the first reading passes and the second data reading fails, a retention failure or an instability failure is identified in the cell at 228. As previously mentioned, SRAM that incorporates 'mismatched' transistors can be adversely affected by operating characteristics that vary from transistor to transistor. For example, such SRAM may be unstable and not retain the desired bit state (e.g., a logic 1 instead of a logic 0 or vice versa).

Fail counts of the failure may then be logged, for example, in a memory tester (not shown) or a database associated with the memory device for later testing reference or analysis. The data base may be, for example, associated with the memory tester for testing one or more such memory devices of a semiconductor wafer.

Figure 4:
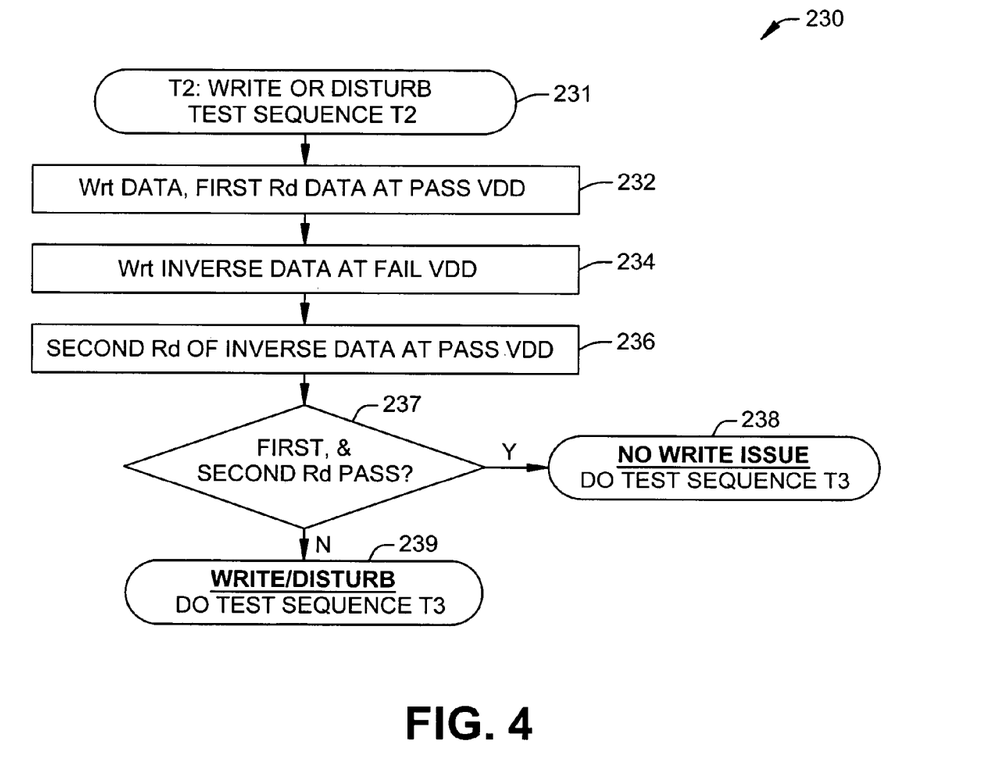

FIG. 4 illustrates an exemplary T2 write or disturb (failure) test sequence 230 of method 200, in accordance with one or more aspects of the present invention. The write or disturb test sequence 230 is used to identify or classify write or disturb failures from among the various soft bit failure modes of an SRAM memory device such as the cell 100 of FIG. 1. Write or disturb test sequence 230 starts at 231 wherein at 232 data is written into a target cell (e.g., or the entire array of cells) at the passing test voltage (e.g., supply voltage, Vdd, Vcc, Vnom at about 1.2V) followed by a first reading of the data also at the passing voltage.

The test voltage is then changed at 234 to a failing voltage, for example, by reducing the voltage to the lower end of the test voltage range (e.g., Vlo at about 0.8 V), or by increasing the voltage to the upper end of the voltage range of interest (e.g., Vhi at about 1.6V) and data is again written into the target cell (e.g., or the entire array of cells). Then at 236, the test voltage is again changed back to the passing voltage level and a second reading of the data is made.

The results of this test sequence are then evaluated at 237 to determine whether the first and second data readings have passed. If it is determined that both the first and second readings pass at 237, then it may also be concluded that no write issue is present in the cell at 238, and the testing may continue to test sequence T3 for further classification. If, however, it is determined at 237 that the first reading passes and the second data reading fails, a write or disturb failure is identified in the cell at 239, and the testing may continue to test sequence T3 for further classification.

Figure 5:
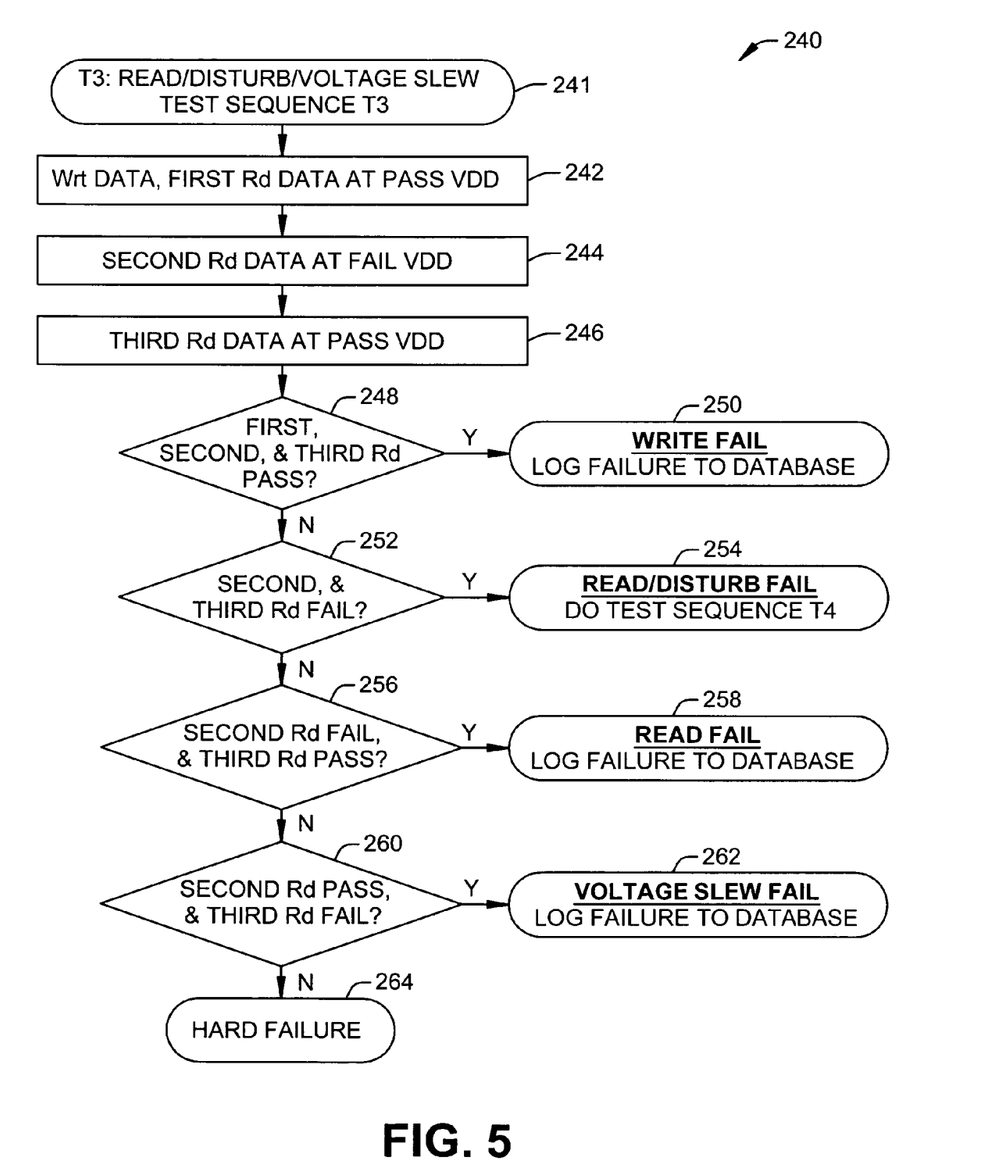

FIG. 5 illustrates an exemplary T3 read, disturb, or voltage slew (failure) test sequence 240 of method 200, in accordance with one or more aspects of the present invention. The read, disturb, or voltage slew test sequence 240 is used to identify or classify read or disturb failures from among the various soft bit failure modes of an SRAM memory device such as the cell 100 of FIG. 1. Read, disturb, or voltage slew test sequence 240 starts at 241 wherein at 242 data is written into a target cell (e.g., or the entire array of cells) at the passing test voltage (e.g., supply voltage, Vdd, Vcc, Vnom at about 1.2V) followed by a first reading of the data also at the passing voltage.

The test voltage is then changed at 244 to a failing voltage, for example, by reducing the voltage to the lower end of the test voltage range (e.g., Vlo at about 0.8 V), or by increasing the voltage to the upper end of the voltage range of interest (e.g., Vhi at about 1.6V). A second reading of the data is then made from the target cell (e.g., or the entire array of cells) at this failing voltage. Then at 246, the test voltage is again changed back to the passing voltage level and a third reading of the data is made.

The results of this test sequence are then evaluated at 248 to determine whether the first, second, and third data readings have passed. If it is determined at 248 that all three readings pass, then it may be concluded that the cell uniquely exhibits a write failure at 250, and the failure or failure count may be logged to the database for later testing or analysis. Otherwise, if one or more of the first, second, and third data readings have failed at 248, and it is determined at 252 that the second and third readings have failed, a read or disturb failure is identified in the cell at 254, and the testing may continue to test sequence T4 for further classification.

If it is determined that the second and third readings have not failed at 252, and it is determined at 256 that the second reading has failed and the third reading has passed, a read failure is uniquely identified in the cell at 258, and the failure or failure count may be logged to the database for later testing or analysis. Thereafter, if it has not been determined that the second reading has failed and the third readings has passed at 256, and it is determined at 260 that the second reading has passed and the third reading has failed, a voltage slew failure is uniquely identified in the cell at 262, and the failure or failure count may be logged to the database for later testing or analysis.

Otherwise, if it has not been determined at 260 that the second reading has passed and the third reading has failed, another type of hard failure is identified at 264. In this hard failure case, a redundant bit may replace the cell, and the failure or failure count may be logged to the database for later testing or analysis.

Figure 6:
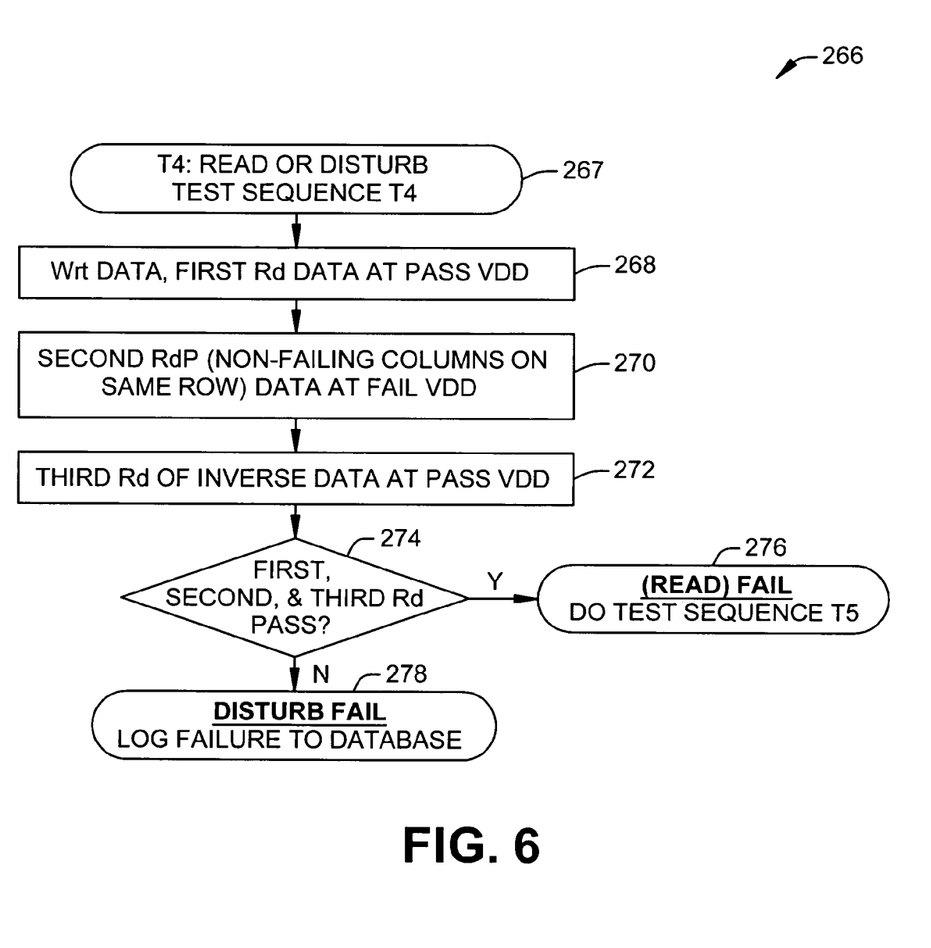

FIG. 6 illustrates an exemplary T4 read or disturb (failure) test sequence 266 of method 200, in accordance with one or more aspects of the present invention. The read or disturb test sequence 266 is used to identify or classify the read or disturb failures from among the various soft bit failure modes of an SRAM memory device such as the cell 100 of FIG. 1. Read or disturb test sequence 266 starts at 267 wherein at 268 data is written into a target cell (e.g., or the entire array of cells) at the passing test voltage (e.g., supply voltage, Vdd, Vcc, Vnom at about 1.2V) followed by a first reading of the data also at the passing voltage.

The test voltage is then changed at 270 to a failing voltage, for example, by reducing the voltage to the lower end of the test voltage range (e.g., Vlo at about 0.8 V), or by increasing the voltage to the upper end of the voltage range of interest (e.g., Vhi at about 1.6V). A second reading of the data is then made at this failing voltage from the target cell or cells within the non-failing columns of the array on the same row of cells identified earlier in test sequences T1-T3. Then at 272, the test voltage is again changed back to the passing voltage level and a third reading of the data is made.

The results of this test sequence are then evaluated at 274 to determine whether the first, second, and third data readings have passed. If it is determined at 274 that all three readings pass, then it may be concluded that a read failure is possible in the cell at 276, and the testing may continue to test sequence T5 for further verification of this classification. Otherwise, if one or more of the first, second, and third data readings have failed at 274, a disturb failure is uniquely identified in the cell at 278, and the failure or failure count may be logged to the database for later testing or analysis.

For example, analysis may comprise evaluating the data results of all the test sequences performed to arrive at an intelligent conclusion as to the unique failure classification for each failed memory cell. In one aspect of the invention, the analysis may need to be performed out of the production environment in what is known as an engineering mode.

Figure 7:
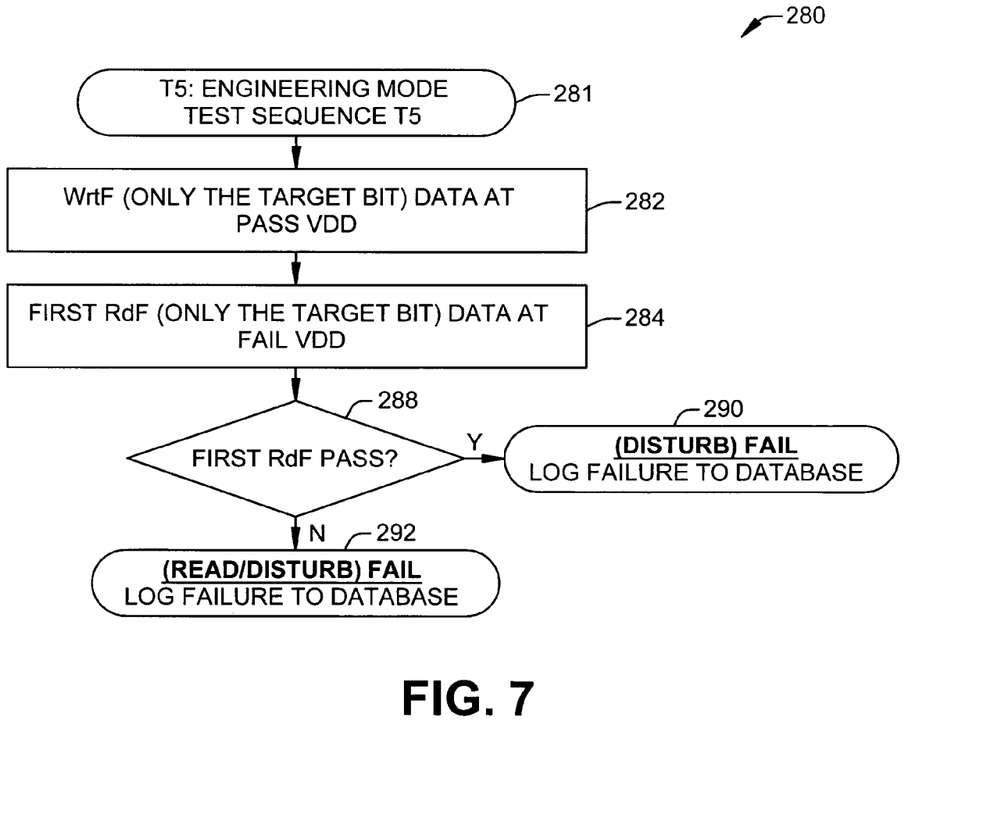

FIG. 7, for example, illustrates one exemplary aspect of implementing a T5 engineering mode test sequence 280 of method 200, in accordance with the present invention. The engineering mode test sequence 280 is used to further identify or classify the read or disturb failures from among the various soft bit failure modes of an SRAM memory device such as the cell 100 of FIG. 1. The engineering mode test sequence 280 is generally not performed in production testing due to test time considerations, but may be done in the engineering mode to verify classification accuracy. Engineering mode test sequence 280 starts at 281 wherein at 282, inverse data is written into a target cell at the passing test voltage (e.g., supply voltage, Vdd, Vcc, Vnom at about 1.2V) followed by writing data (e.g., true data, non-inverse data) into the target cell at the passing voltage.

The test voltage is then changed at 284 to a failing voltage, for example, by reducing the voltage to the lower end of the test voltage range (e.g., Vlo at about 0.8 V), or by increasing the voltage to the upper end of the voltage range of interest (e.g., Vhi at about 1.6V). A first reading of the data of target bit is then made at this failing voltage from the target cell.

The results of this test sequence are then evaluated at 288 to determine whether the first data reading has passed. If it is determined at 288 that the target bit reading has passed, then it may be concluded that a disturb failure is uniquely identified in the cell at 290. Otherwise, if the first data reading has failed at 288, it may be concluded that either a read or disturb failure is possible in the cell at 292. In either case, of the engineering mode test sequence 280, the failure or failure count may also be logged to the database for further testing or analysis, or otherwise noted by the tester or a test engineer.

Figure 8A:
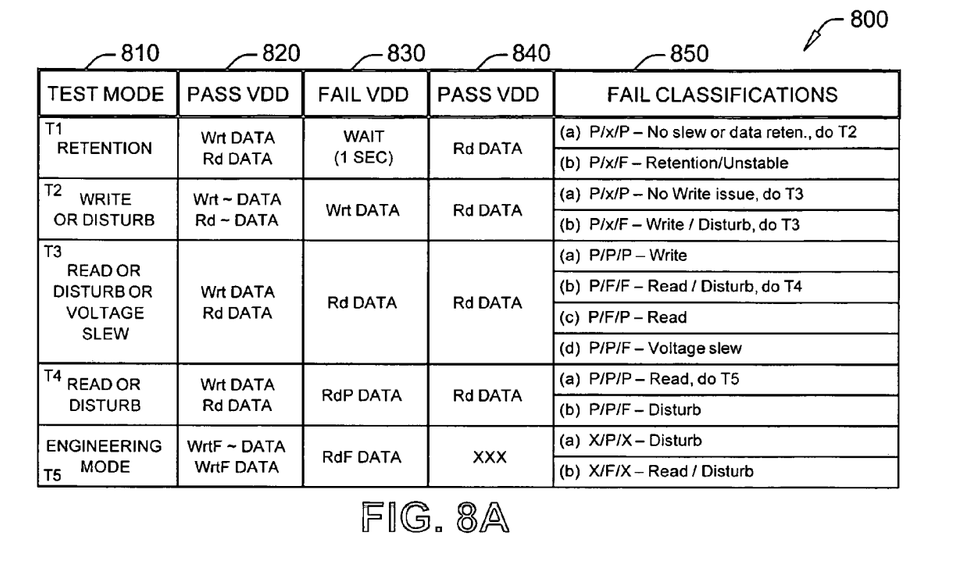
FIG. 8A is a chart summarizing the various test sequences used in the exemplary testing method of FIGS. 3-7, and the possible failure classifications that may result in the testing of an SRAM memory device according to one or more aspects of the present invention.

FIG. 8A illustrates a summary of the various test sequences 800, such as may be used in the exemplary soft bit failure testing method 200 of FIGS. 3-7. Summary 800 further illustrates exemplary soft bit failure classifications that may result in the testing of an SRAM memory device according to one or more aspects of the present invention. For example, each exemplary test mode 810 comprises a test sequence (e.g., T1-T5), which begins with a write and/or a read at a passing test voltage (e.g., supply voltage, Vdd, Vcc, Vnom at about 1.2V) 820, then another write, read, or wait at a failing test voltage (e.g., the lower end of the test voltage range, Vlo at about 0.8 V, or the upper end of the voltage range of interest, Vhi at about 1.6V) 830. Then each test sequence is restored to the passing voltage for a final read 840 (with the exception of the engineering mode T5, which has no additional read action). Summary 800 also shows the expected failure classifications 850 which are determined from an analysis of the data obtained from the one or more readings thereof.

For example, if retention test sequence T1 passes the first read, but fails the second read, the (b) fail classification (P/x/F) is determined, indicating that the cell has a retention or unstable condition failure. In this case, the failure is uniquely classified as such and the failure may be data logged, for example, in a database. If, however, retention test sequence T1 passes the first read and the second read, the (a) fail classification (P/x/P) is determined, indicating that the cell has no slew rate or data retention failure issues, so testing needs further testing at T2 to identify the nature of the cell failure.

Figure 8B:
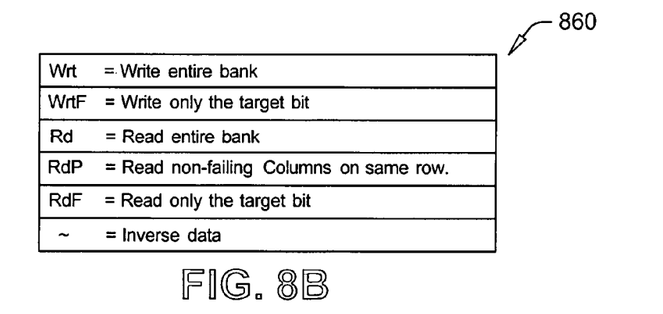
FIG. 8B is a chart of some of the term definitions used in the test sequences of the exemplary testing method of FIGS. 3-7.

FIG. 8B illustrates a chart of some of the term definitions 860 used in the test sequences of FIG. 8A utilizing the exemplary testing method 200 of FIGS. 3-7.

Figure 8C:
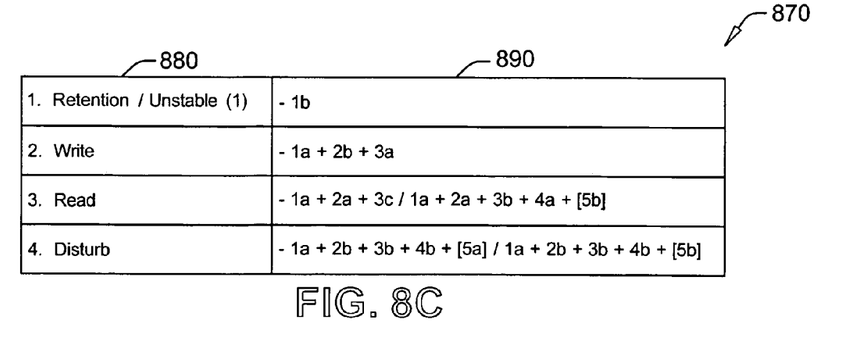
FIG. 8C is a chart summarizing the test sequence results which are needed to uniquely determine the failure classifications of FIG. 8A.

FIG. 8C illustrates the test sequence results 870 which are needed to uniquely determine some of the failure classifications 850 of FIG. 8A. Various failure determinations 880 may be made based on obtaining one or more specific sequences of test results 890 by performing one or more of the test sequences 800. For example, to determine a write failure at 880, retention test sequence T1 will yield an (a) fail classification (1a), write or disturb test sequence T2 will yield a (b) fail classification (2b), and read/disturb/voltage slew test sequence T3 will yield an (a) fail classification (3a). Thus, the combination of all three test results (1a+2b+3a) 890 yields the write failure 880.

FIG. 8C also illustrates that multiple test result 890 sequences may obtain the same failure result 880. For example, a read may be classified by either a 1a+2a+3c sequence, or by a 1a+2a+3b+4a+[5b] test result sequence. The brackets around the 5b result further identify the engineering mode T5.

Although four failure results 880 are listed in FIG. 8C, it will be appreciated that other failure types may be identified in accordance with the method of the present invention, such as the voltage slew rate failure 3d of test sequence T3 of FIG. 8A.

In addition, the methods of the present invention find application in SRAM memory devices, for example, 6T SRAM devices, and other such memory devices where it is desirable to uniquely classify the soft bit failure mode of the memory cells. Accordingly, depending on the failure type identified, different corrective actions may be chosen based on fast and accurate real time analysis of the failure types to provide direction for device improvements.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In addition, while a particular feature or aspect of the invention may have been disclosed with respect to only one of several implementations, such feature or aspect may be combined with one or more other features or aspects of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising." Also, the term "exemplary" is merely meant to mean an example, rather than the best. It is also to be appreciated that layers and/or elements depicted herein are illustrated with particular dimensions relative to one another (e.g., layer to layer dimensions and/or orientations) for purposes of simplicity and ease of understanding, and that actual dimensions of the elements may differ substantially from that illustrated herein.

What is claimed is:

1. A method of differentiating between various soft bit failure modes in a static random access memory device, comprising:
    performing a data retention test on a cell of the memory device having a soft bit failure to determine whether the cell exhibits a data retention failure,
    performing a write or disturb test sequence on the cell of the memory device not having a data retention failure to determine whether the cell exhibits a write or disturb failure;
    performing a read or disturb test sequence on the cell to determine whether the cell exhibits a read or disturb failure; and
    further comprising performing a disturb test sequence on the cell of the memory device having a read or disturb failure to determine whether the cell exhibits a disturb failure.

2. The method of claim 1, further comprising analyzing data from the tests to determine whether the cell exhibits one of a write, read, or disturb failure.

3. The method of claim 1, wherein the disturb test sequence comprises conducting a sequence of tests on a target cell of the memory device, comprising:
    writing data and performing a first reading of the data at a passing test voltage;
    performing a second reading of the data from the non-failing columns of cells at a failing test voltage;
    performing a third reading of the data on the target cell at the passing test voltage; and
    analyzing the first, second, and third data readings to determine if the cell exhibits a read failure or a disturb failure.

4. The method of claim 3, wherein the analyzing the first, second, and third data readings to determine if the cell exhibits a read failure or a disturb failure comprises analyzing the data to classify the failure mode comprising:
    determining whether the first, second, and third data readings pass, thereby indicating that a read failure may exist in the target cell; and
    determining whether the first reading of the data passes, the second reading of the data passes, and the third reading of the data fails, thereby indicating that a disturb failure exists in the target cell.

5. The method of claim 3, wherein the passing test voltage comprises a nominal voltage, and the failing voltage comprises one of a lower test voltage and a higher test voltage.

6. A method of differentiating between various soft bit failure modes in a static random access memory device, comprising:
    performing a data retention test on a cell of the memory device having a soft bit failure to determine whether the cell exhibits a data retention failure;
    performing a write or disturb test sequence on the cell of the memory device not having a data retention failure to determine whether the cell exhibits a write or disturb failure;
    performing a read or disturb test sequence on the cell to determine whether the cell exhibits a read or disturb failure;
    performing a disturb test sequence on the cell of the memory device having a read or disturb failure to determine whether the cell exhibits a disturb failure;
    comprising analyzing data from the tests to determine whether the cell exhibits one of a write, read, or disturb failure; and
    performing an engineering mode test sequence on the cell of the memory device having a read failure to determine whether the cell exhibits a read failure or a disturb failure, thereby uniquely classifying a failure mode for the cell exhibiting one of a write, read, or disturb failure.

7. A method of differentiating between various soft bit failure modes in a static random access memory device, comprising:
    performing a data retention test on a cell of the memory device having a soft bit failure to determine whether the cell exhibits a data retention failure; and
    further comprising performing a hard/soft bit failure test sequence on a cell of the memory device to determine whether the cell exhibits a hard bit failure or a soft bit failure, prior to performing the data retention test.

8. The method of claim 7, wherein the hard/soft bit failure test sequence comprises conducting a defect activating test sequence using a standard series of production test algorithms to determine whether the cell exhibits a hard bit failure or a soft bit failure.

9. The method of claim 6, wherein the engineering mode test sequence comprises conducting a sequence of tests on a target cell of the memory device in an engineering mode to uniquely classify cells of the memory exhibiting one of a disturb failure, or a read or disturb failure, comprising:
    writing an inverse of the data to the target cell at a passing test voltage;
    writing true data to the target cell at a passing test voltage;
    performing a first reading of the true data from the target cell at a failing test voltage; and
    analyzing the first data reading to determine if the cell exhibits a disturb failure, or a read or disturb failure.

10. The method of claim 9, wherein the analyzing the first data reading to determine if the cell exhibits a disturb failure, or a read or disturb failure comprises analyzing the data to classify the failure mode comprising:
    determining whether the first data readings passes, thereby indicating that a disturb failure exists in the target cell; and
    determining whether the first reading of the data fails, thereby indicating that a read or disturb failure exists in the target cell.

11. The method of claim 9, wherein the passing test voltage comprises a nominal voltage, and the failing voltage comprises one of a lower test voltage and a higher test voltage.

12. The method of claim 6, further comprising logging the data from the tests of each memory cell before performing the failure analysis determinations.

13. The method of claim 6, wherein one of a checkerboard and an inverse checkerboard test pattern is used in the data retention test sequence and one or more subsequent test sequences.

14. A method of differentiating between various soft bit failure modes in a static random access memory device, comprising:
    performing a data retention test on a cell of the memory device having a soft bit failure to determine whether the cell exhibits a data retention failure, wherein the data retention test comprises conducting a defect activating test on a target cell of the memory device, comprising:
    writing data and performing a first reading of the data at a passing test voltage;
    changing the test voltage level to a failing test voltage;
    waiting for a predetermined time period;
    changing the test voltage level to the passing test voltage;
    performing a second reading of the data from the target cell; and
    analyzing the first and second data readings to determine if the cell exhibits a data retention failure or an unstable condition.

15. The method of claim 14, wherein the analyzing the first and second data readings to determine if the cell exhibits a data retention failure or an unstable condition comprises analyzing the data to classify the failure mode comprising:
    determining whether the first and second reading of the data pass, thereby indicating that no slew or data retention issues exist in the target cell; and
    determining whether the first reading of the data passes and the second reading of the data fails, thereby indicating that a data retention failure or an unstable condition exists in the target cell.

16. The method of claim 14, wherein the passing test voltage comprises a nominal voltage, and the failing voltage comprises one of a lower test voltage and a higher test voltage.

17. A method of differentiating between various soft bit failure modes in a static random access memory device, comprising:
    performing a data retention test on a cell of the memory device having a soft bit failure to determine whether the cell exhibits a data retention failure,
    performing a write or disturb test sequence on the cell of the memory device not having a data retention failure to determine whether the cell exhibits a write or disturb failure, wherein the write or disturb test sequence comprises conducting a sequence of tests on a target cell of the memory device, comprising:
    writing an inverse of the data and performing a first reading of the inverse data at
    a passing test voltage;
    writing true data at a failing test voltage;
    performing a second reading of the true data on the target cell at the passing test voltage; and
    analyzing the first and second data readings to determine if the cell exhibits a write failure or a disturb failure.

18. The method of claim 17, wherein the analyzing the first and second data readings to determine if the cell exhibits a write failure or a disturb failure comprises analyzing the data to classify the failure mode comprising:
    determining whether the first and second reading of the data pass, thereby indicating that no write issue exist in the target cell; and
    determining whether the first reading of the data passes and the second reading of the data fails, thereby indicating that a write failure or a disturb failure exists in the target cell.

19. The method of claim 17, wherein the passing test voltage comprises a nominal voltage, and the failing voltage comprises one of a lower test voltage and a higher test voltage.

20. A method of differentiating between various soft bit failure modes in a static random access memory device, comprising:
    performing a data retention test on a cell of the memory device having a soft bit failure to determine whether the cell exhibits a data retention failure,
    performing a write or disturb test sequence on the cell of the memory device not having a data retention failure to determine whether the cell exhibits a write or disturb failure;
    performing a read or disturb test sequence on the cell to determine whether the cell exhibits a read or disturb failure, wherein the read or disturb test sequence comprises conducting a sequence of tests on a target cell of the memory device, comprising:
    writing data and performing a first reading of the data at a passing test voltage;
    performing a second reading of the data on the target cell at a failing test voltage;
    performing a third reading of the data on the target cell at the passing test voltage; and
    analyzing the first, second, and third data readings to determine if the cell exhibits a write failure, a read failure, or a disturb failure.

21. The method of claim 20, wherein the analyzing the first, second, and third data readings to determine if the cell exhibits a write failure, a read failure, or a disturb failure comprises analyzing the data to classify the failure mode comprising:
    determining whether the first, second, and third reading of the data passes, thereby indicating that a write failure exists in the target cell;
    determining whether the first reading of the data passes, the second reading of the data fails, and the third reading of the data fails, thereby indicating that a read failure or a disturb failure exists in the target cell;
    determining whether the first reading of the data passes, the second reading of the data fails, and the third reading of the data passes, thereby indicating that a read failure exists in the target cell; and
    determining whether the first reading of the data passes, the second reading of the data passes, and the third reading of the data fails, thereby indicating that a voltage slew condition exists in the target cell.

22. The method of claim 20, wherein the passing test voltage comprises a nominal voltage, and the failing voltage comprises one of a lower test voltage and a higher test voltage.

* * * * *